United States Patent [19]

Gorshe

[11] Patent Number: 4,853,931
[45] Date of Patent: Aug. 1, 1989

[54] VIOLATING ALL ZERO OCTET (VAZO) DETECTOR FOR A ZERO BYTE TIME SLOT INTERCHANGE (ZBTSI) ENCODER

[75] Inventor: Steven S. Gorshe, Phoenix, Ariz.

[73] Assignee: Siemens Transmission Systems, Inc., Phoenix, Ariz.

[21] Appl. No.: 181,785

[22] Filed: Apr. 15, 1988

[51] Int. Cl.$^4$ .............................................. H04Q 7/00
[52] U.S. Cl. ......................................... 371/55; 371/57
[58] Field of Search ..................... 371/55, 57, 22, 48

[56] References Cited

U.S. PATENT DOCUMENTS

| | | | |
|---|---|---|---|
| 3,156,893 | 11/1964 | Harel | 371/55 |
| 3,405,235 | 2/1965 | Carter | 371/55 |
| 4,502,142 | 2/1985 | Csengory | 371/55 |
| 4,644,546 | 2/1987 | Doi | 371/55 |

*Primary Examiner*—Michael R. Fleming
*Attorney, Agent, or Firm*—Jeffrey P. Morris

[57] ABSTRACT

A Violating All Zero Octet (VAZO) detector for a ZBTSI clear channel data transmission system is described, which is optimized for minimum logic gate count, minimum circuit complexity, minimum external control signals and minimum signal processing delay, in a VLSI hardware embodiment which is advantageously implemented in application specific integrated circuit (ASIC) technology. An array of logic NOR gates scans input data for zero strings of data that could combine with an all-zero octet to violate the zero string criterion enables a zero string search to be performed with a minimum of circuit complexity. The use of an input shift register to buffer input data for other portions of the associated ZBTSI encoder provides for a minimized number of gates in a VLSI implementation.

13 Claims, 8 Drawing Sheets

FIG. 1
VAZO DETECTOR

| FIG. 2A | FIG. 2B |

VIOLATING ALL ZERO OCTET (VAZO) DETECTOR FOR A ZERO BYTE TIME SLOT INTERCHANGE (ZBTSI) ENCODER

CROSS REFERENCE TO RELATED APPLICATIONS

Steven S. Gorshe, U.S. Pat. No. 4,794,604, issued Dec. 27, 1988, titled Optimal Error Correction Method For Zero Byte Time Slot Interchange (ZBTSI) Clear Channel Data Transmission, assigned to the same assignee as the present invention.

Steven S. Gorshe, Ser. No. 158,002, filed Feb. 19, 1988, titled Zero Byte Time Slot Interchange (ZBTSI) Encoder, assigned to the same assignee as the present invention.

BACKGROUND OF THE INVENTION

1. Field of the Invention

The present invention relates generally to data detection and transmission techniques for use in telecommunications equipment. More specifically, the present invention relates to an improved data detector for use in Zero Byte Time Slot Interchange (ZBTSI) transmission equipment, such that the improved detector is optimized for VLSI implementation with a minimum gate count, low circuit complexity, minimum number of external control signals and a minimum processing delay. The present invention is advantageously applicable for use in Application Specific Integrated Circuit (ASIC) technologies such as gate arrays and standard cells.

2. Description of the Prior Art

The Integrated Services Digital Network (ISDN) in its implementation in the North American digital telecommunications transmission network requires a full or unconstrained clear channel capability for 64-kilobit per second (Kb/sec) communication channels. The encoding technique known as Zero-Byte Time Slot Interchange (ZBTSI) is a well known technique for providing clear channel capability, also known as bit-sequence independence over DS1 transmission carrier facilities within the North American telephone network. At present, the North American telephone network limits the number of consecutive logic "zeros" that can be transmitted because the existing bipolar line code does not transmit any pulses for a logic "zero." As a result, the transmission of long strings of logic "zeros" can cause telecommunications line haul equipment such as multiplexers and protection switches to lose timing accuracy or clock recovery altogether.

As is well known, a single PCM telecommunications channel, known as a "DS0" channel, operates at 64 kilobits per second (Kb/sec) in each direction of transmission to transmit and receive 8,000 8-bit samples per second of a desired telecommunication, whether voice or data. According to the Bell standard, individual two-way channels are multiplexed into higher speed channels for long distance transmission. As a particular example, 24 8-bit samples, one from each DS0 channel, are arranged serially in a single transmission frame together with a single framing bit to form a 193-bit frame.

Transmission of successive 193-bit frames at a rate of 8,000 frames per second determines the bit rate of 1.544 Mb/sec. Set forth in the following table are some of the Bell standard digital transmission lines or hierarchical levels with their associated transmission rates and numbers of channels:

TABLE 1

| Transmission Line | Number of Voice Channels | Transmission Rate |
|---|---|---|
| DS0 | 1 | 64 Kb/sec. |
| DS1 | 24 | Approx. 1.5 Mb/sec. |
| DS1C | 48 | Approx. 3 Mb/sec. |
| DS2 | 96 | Approx. 6 Mb/sec. |
| DS3 | 672 | Approx. 45 Mb/sec. |

The present North American digital network cannot directly accommodate clear channel capability because of the minimum pulse density restrictions for 1.544 Mb/s DS1 signals and 3.152 Mb/s DS1C requires an average of at least one pulse in eight pulse positions and no more than 15 pulse positions without a pulse. The clock recovery circuit of these repeaters and the receive section of channel banks and other source/sink devices will lose timing accuracy, or timing altogether, in the presence of low logic "ones" density or long strings of logic "zeros." TIC-type repeaters have a similar restriction of at least a $\frac{1}{8}$ pulse density over any 150 consecutive pulse positions.

To satisfy the clock recovery requirements of repeaters and source/sink devices, several design techniques are used to guarantee that devices originating DS1 and DS1C signals do not exceed the aforementioned pulse density constraints. In order to properly encode the highest analog frequency of a voice channel, the sampling rate has been established at 8000 samples per second. This sampling rate is also the frame rate for the DS1 signal. Each sample is encoded into an eight-bit word, which permits the dynamic range of the human voice to be mapped over 256 discrete steps in amplitude. With 8000 samples are per second times 8 bits per sample, the result is 64 Kb/s for each of the individual DS0 channels. It is apparent that only the all-zero byte need be restricted, which would offer the ratio 255/256 efficiency, or 99.6 percent of the 64 kb/s channel, as unconstrained information bits for channel users. Unfortunately, existing source/sink devices are not nearly this efficient.

Analog voice signals with associated signaling are coded into the 64 Kb/s channels using a combination of robbed-bit signaling and zero code suppression to guarantee the presence of at least one logic "one" in each byte. For digital data channels, a different technique is employed to ensure that the proper "ones" density is maintained. During transmission of customer digital data, a designated control bit is forced to a logic "one" on a full-time basis. Since the sampling rate remains at 8000 samples per second and there are now only 7 bits per sample available to the channel users, the effective unconstrained information rate to the channel user reduces to 56 Kb/s.

All of the source/sink designs which do not provide for clear channel capability employ at least one of the aforementioned techniques, which reduce the available information bits in the 64 Kb/s channels.

This includes virtually all source/sink devices currently in use in the North American telecommunications network. With the advent of ISDN, some scheme of restoring user access to the full 64 Kb/s channel without restriction on the quantity and sequence of ones and zeros is required. The same requirement exists for all remaining ISDN primary-rate interfaces. The provisioning of clear channel capability requires that new source/sink devices such as PCM terminals allow unconstrained primary-rate digital signals to enter and leave the network intact, and also continue to maintain the minimum pulse density requirements toward line-haul elements. Line-haul elements include repeaters, multiplexers, and automatic protection switches. To this extent, the North American network is not operating with clear channel capability with any of the known prior art techniques currently operational. The clear channel capability function is actually synthesized condition, converting the clear channel signal to a form which can be transported by the line-haul network elements, then back to the original signal at the far-end source/sink device.

ZBTSI is a known format which allows continued use of a bipolar line code, i.e., an AMI line code, but which does not require any changes to existing telecommunications line haul equipment or to the operation, administration, maintenance and provisioning procedures associated therewith. The first ZBTSI implementation was introduced in 1983 for use in point-to-point nonswitched connections between customer premises equipment locations.

The ZBTSI algorithm is described in detail in the ANSI accredited Committee T1 document T1 LB/87-127 and was published to the Committee in September, 1987. In essence, ZBTSI encoding provides bit sequence independence (clear channel capability) in T1-type digital telecommunication transmission networks by encoding and arranging the PCM data to ensure that the minimum pulse density requirements for T1-type equipment is satisfied.

The function of a ZBTSI encoder is to scramble the incoming data, scan the scrambled data for violating zero strings, and remove those zero strings by constructing an address chain of the zero-byte locations and inserting that address chain into the zero-byte locations. A bit in the extended superframe (ESF) format frame-bit data link is set to indicate whether zero bytes were found and processed by the encoder. Specifically, the data is processed in blocks of 96 bytes or octets which are numbered sequencially from 1 to 96 in the order in which they are received. The term "octet" here is used to refer to an 8-bit data word which corresponds in bit alignment to the location of a DSO channel. If no violating all-zero octets (VAZOs) are found in the 96 octet group, Octet 96 will be transmitted first with the remaining octets transmitted in order from Octet 1 to Octet 95. Octet 96 is displaced whenever a VAZO is found in the 96 octet data group. The normal position of Octet 96 now contains the address of the first VAZO location. If multiple VAZOs are found, then the first VAZO location will contain the address of the second VAZO location, the second VAZO location will contain the address of the third location, and etc. The data from Octet 96 is now contained within the location of the last VAZO in the 96 octet group. One of the bits in the VAZO address field, serves as the Indicator of the Last VAZO Address (ILVA) and is used by the decoder to determine the end of the address chain.

An all-zero octet is considered a VAZO when it combines with the octets adjacent to it such that one of the following conditions is created:

(A) The all-zero octet is not Octet 1, 95, or 96 and it combines with its adjacent octets to form a data string with 15 or more consecutive logic zeros.

(B) The all-zero octet is not Octet 1, 95, or 96 and the data in either adjacent octet contains less than two logic ones.

(C) The all-zero octet is Octet 1 or 95.

(D) The all-zero octet is Octet 96 and (a) there is at least one other VAZO in that 96-octet group, or (b) the data in Octet 1 contains less than two logic ones.

SUMMARY OF THE INVENTION

A Violating All Zero Octet (VAZO) detector for a ZBTSI clear channel data transmission system is described, which is optimized for minimum logic gate count, minimum circuit complexity, minimum external control signals and minimum signal processing delay, in a VLSI hardware embodiment which is advantageously implemented in application specific integrated circuit (ASIC) technology. An array of logic NOR gates scans input data for zero strings of data that could combine with an all-zero octet to violate the zero string criterion enables a zero string search to be performed with a minimum of circuit complexity. The use of an input shift register to buffer input data for other portions of the associated ZBTSI encoder provides for a minimized number of gates in a VLSI implementation.

It is therefore a primary object of the invention to provide a VAZO detector for ZBTSI encoded telecommunications data transmission equipment that is advantageously implementable in VLSI technology.

Another object of the invention is to provide a VAZO detector having a minimized circuit complexity and minimized number of logic gates in its circuit configurations.

Another object of the invention is to provide a VAZO detector which is implementable in a cost effective manner in ASIC technologies such as gate arrays and standard cells.

Another object of the invention is to provide a VAZO detector having a minimized number of external control signals.

Yet another object of the invention is to provide a VAZO detector having a minimized signal processing delay.

The foregoing and other objects and advantages of the invention will become apparent form the following detailed description of a preferred embodiment of the invention as illustrated by the accompanying drawings, wherein:

DESCRIPTION OF THE PREFERRED EMBODIMENT

The Zero Byte Time Slot Interchange (ZBTSI) algorithm is described in detail in the aforementioned cross-referenced patent application, Ser. No. 067,901 of applicant and reference is made thereto also for circuit details of ZBTSI decoder, and control logic circuitry with which the VAZO detector of the present invention may be utilized. Reference is also made to the aforementioned cross-referenced patent application, Ser. No. 158,002 for details of a ZBTSI encoder for encoding ZBTSI data which is operated upon by the detector of the present invention. As described in the aforementioned cross-referenced application Ser. No. 067,901, the ZBTSI algorithm performs its processing at a logic level rather than operating directly on the final line code, and treats each DS1 frame as comprised of 24 8-bit channels plus a framing bit in the first bit position. The channelization of the data within the frame is independent of the ZBTSI algorithm. The ZBTSI encoder operates on blocks of 96 8-bit channels, which is four DS1 frames. Each 8-bit channel is called an octet and the ZBTSI algorithm numbers them from 01 to 96. A ZBTSI processing indicator flag bit, the Z-bit, is associated with each 96-octet group and is transmitted at the beginning of each 96-octet group. The Z-bit is carried in 2 kb/s of the extended superframe (ESF) frame bit data link. The assignment of frame bits (F-bits) in the ESF with ZBTSI encoding is shown in the table below where:

FPS is the Framing Pattern Sequence
FDL is the Frame Data Link (message bits m)
ZBTSI is ZBTSI encoding flag bits (Z-bits)
CRC is Cyclic Redundancy Check

TABLE 2

| FRAME NO. | BIT NO. | FPS | FDL | ZBTSI | CRC |
|---|---|---|---|---|---|
| 1 | 0 | — | — | Z | — |
| 2 | 193 | — | — | — | C1 |
| 3 | 386 | — | m | — | — |
| 4 | 579 | 0 | — | — | — |
| 5 | 772 | — | — | Z | — |
| 6 | 965 | — | — | — | C2 |
| 7 | 1158 | — | m | — | — |
| 8 | 1351 | 0 | — | — | — |
| 9 | 1544 | — | — | Z | — |
| 10 | 1737 | — | — | — | C3 |
| 11 | 1930 | — | m | — | — |
| 12 | 2123 | 1 | — | — | — |
| 13 | 2316 | — | — | Z | — |
| 14 | 2509 | — | — | — | C4 |
| 15 | 2702 | — | m | — | — |
| 16 | 2895 | 0 | — | — | — |
| 17 | 3088 | — | — | Z | — |
| 18 | 3281 | — | — | — | C5 |
| 19 | 3474 | — | m | — | — |
| 20 | 3667 | 1 | — | — | — |
| 21 | 3860 | — | — | — | — |
| 22 | 4053 | — | — | — | C6 |
| 23 | 4246 | — | m | — | — |
| 24 | 4439 | 1 | — | — | — |

The basic principle of the ZBTSI algorithm can be summarized as follows. The PCM data, except for the F-bits, is scrambled by a frame-synchronized scrambler as it enters the ZBTSI encoder and is descrambled as it exits the ZBTSI decoder. First, the data is searched on an octet-by-octet basis in order to determine whether the DS1 maximum zero string or minimum ones density requirements is violated. If either of the aforementioned requirements is violated, an address chain is constructed to locate all of the all-zero octets involved. The addresses are then inserted into the locations of the all-zero octets. One of the octets, octet 96, is displaced in order to provide a constant storage location for the first address. The original value of octet 96 is stored in the location of the last all-zero octet. The final step of the ZBTSI encoding process is to set the Z-bit to the appropriate value. The ZBTSI decoder simply reverses the process performed at the encoder. The decoder may also perform partial error detection and correction. Scrambling in telecommunication data transmission is well known, and reference can be made for detailed descriptions of such scramblers, by way of example, to U.S. Pat. No. 3,649,915; Digital Data Scrambler-Descrambler Apparatus for Improved Error Performance. The ESF cyclic redundancy check is calculated before the ZBTSI encoder stage at a DS1 signal source and is calculated after the ZBTSI decoder at a DS1 sink device.

Figure 1:
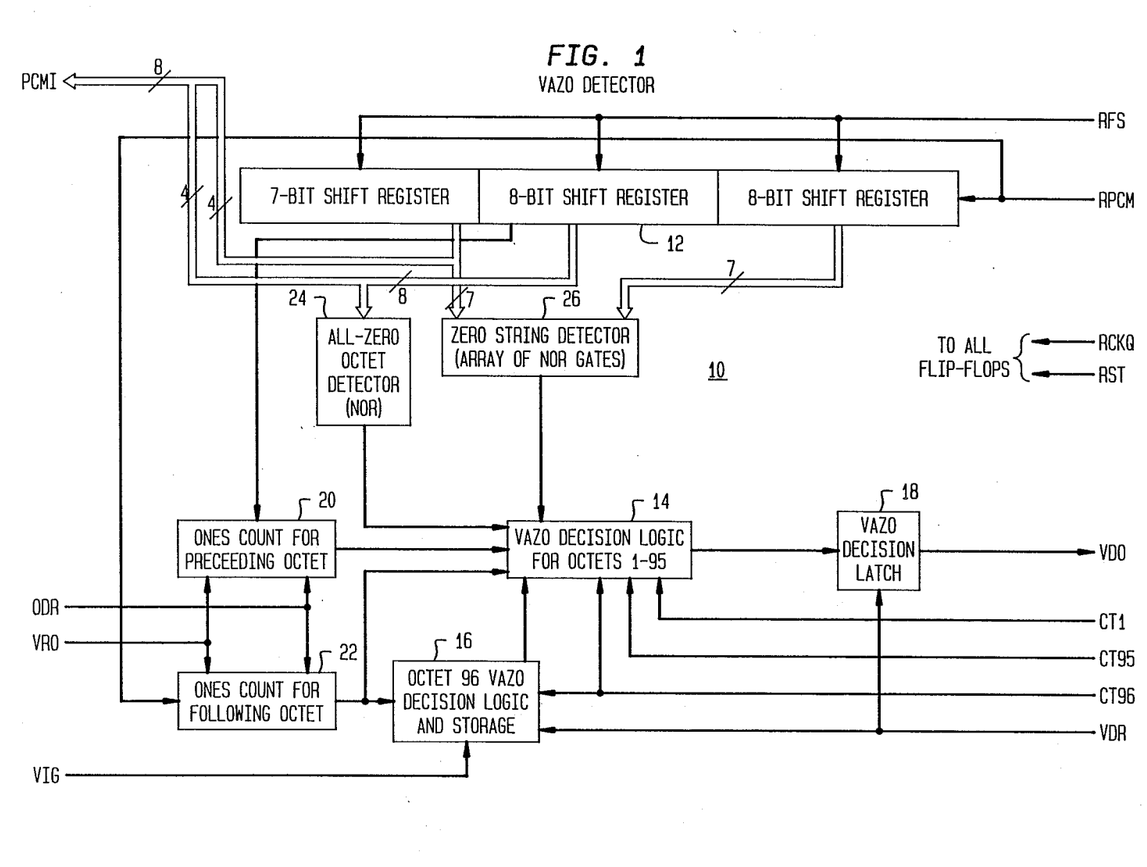
FIG. 1 is a block diagram of a VAZO detector in accordance with the invention.

Referring to FIG. 1, a block diagram of a VAZO detector of the present invention is shown generally at 10. The principal signal inputs/outputs which are coupled to the VAZO detector 10 are shown in FIG. 1 and waveforms of each of these signal inputs/outputs correspond to and are illustrated by the timing diagrams of FIGS. 8(a) through 8(k). Scrambled PCM data (RPCM) is input to the input shift register 12. The DS1 frame synchronization pulse RFS is also input to each section of input shift register 12. The PCM data clock RCKQ and the reset signal RST are input to all circuit flip-flops. The octet count of logic "1" signal CT1, which indicates that Octet 1 is the current octet under examination by the VAZO detector 10 is coupled to VAZO decision logic circuit 14. The Octet count of "95" signal CT95, which indicates that Octet 95 is the current octet under examination by the VAZO detector 10 is also coupled to VAZO decision logic 14. The Octet count of "96" signal CT96, which indicates that Octet 96 is the current octet under examination by the VAZO detector 10 is coupled to VAZO decision logic 14 for Octets 1 through 95 and to VAZO decision logic 16 for Octet 96 and associated storage. The signal indicative of whether a VAZO was already found in a group, VIG, is also coupled to VAZO decision logic 16. The VAZO detector synchronous reset signal VDR is coupled to VAZO decision logic 16 and to VAZO decision latch 18. Signal VDR reinitializes the VAZO detector 10 at the beginning of each octet. The ones density counter synchronous reset signal ODR is coupled to the circuit 20 which indicates the logic ones count for the preceding octet and to the circuit 22 which indicates the logic ones count for the following octet. The ones density counter secondary synchronous reset signal VRO is also coupled to logic circuits 20 and 22. The aforementioned reset signal RST, which is coupled to all circuit flip-flops, provides initialization when power is first connected to the circuit. The outputs of the VAZO detector 10 are also illustrated, and will now be enumerated. The VAZO detector 10 output signal VDO from the VAZO decision latch 18 is active "high" whenever the current octet is declared to be a VAZO. The PCM input bus PCMI output from the input shift register 12 is coupled to the other circuits within the detector 10, including the All-zero octet detector 24 and the Zero string detector 26, and the aforementioned ZBTSI encoder which must process the PCM data. The timing diagrams shown in FIGS. 8(a) through 8(k) are illustrative of the area around the 96-octet group boundary.

The operation of the VAZO detector 10 of FIG. 1 will now be described, with further reference to the more detailed logic diagrams of FIGS. 2 through 7. PCM data (RPCM) is coupled into the 23-bit input shift register 12 shown in FIG. 2, and which is comprised of twenty-three flip-flops a1 through a23 configured as shown. Each of the individual flip-flops a1–a23 has internal logic structure as shown in FIG. 5. The aforedescribed RST, RPCM, RCKQ, RFS and PCMI inputs/outputs are arranged as shown. When the TE input to each of flip-flops a1–a23 is logic "high" and the TEN input is logic "low", the TI input is selected; and when the TE input is logic "low" and the TEN input is logic "high", the D input is selected. The 23-bit length of shift register 12 is the optimum size, since this number of flip-flops allows the current octet plus the minimum sufficient information about the octets adjacent to it to occupy the shift register at the time when the VAZO decision is made. The individual flip-flops a1–a23 are configured so that the shift register 12 will shift the PCM data forward by one stage for each cycle of the RCKQ signal (the PCM data clock) as long as the RFS signal (the DS1 frame synchronization pulse) is "low". When the RFS signal is "high", which indicates that the PCM data bit at the input of the shift register 12 is a frame bit instead of a payload data bit, the shift register 12 holds its values as stored. Thus, the frame bits are prohibited entry into the shift register 12.

Figure 2A:
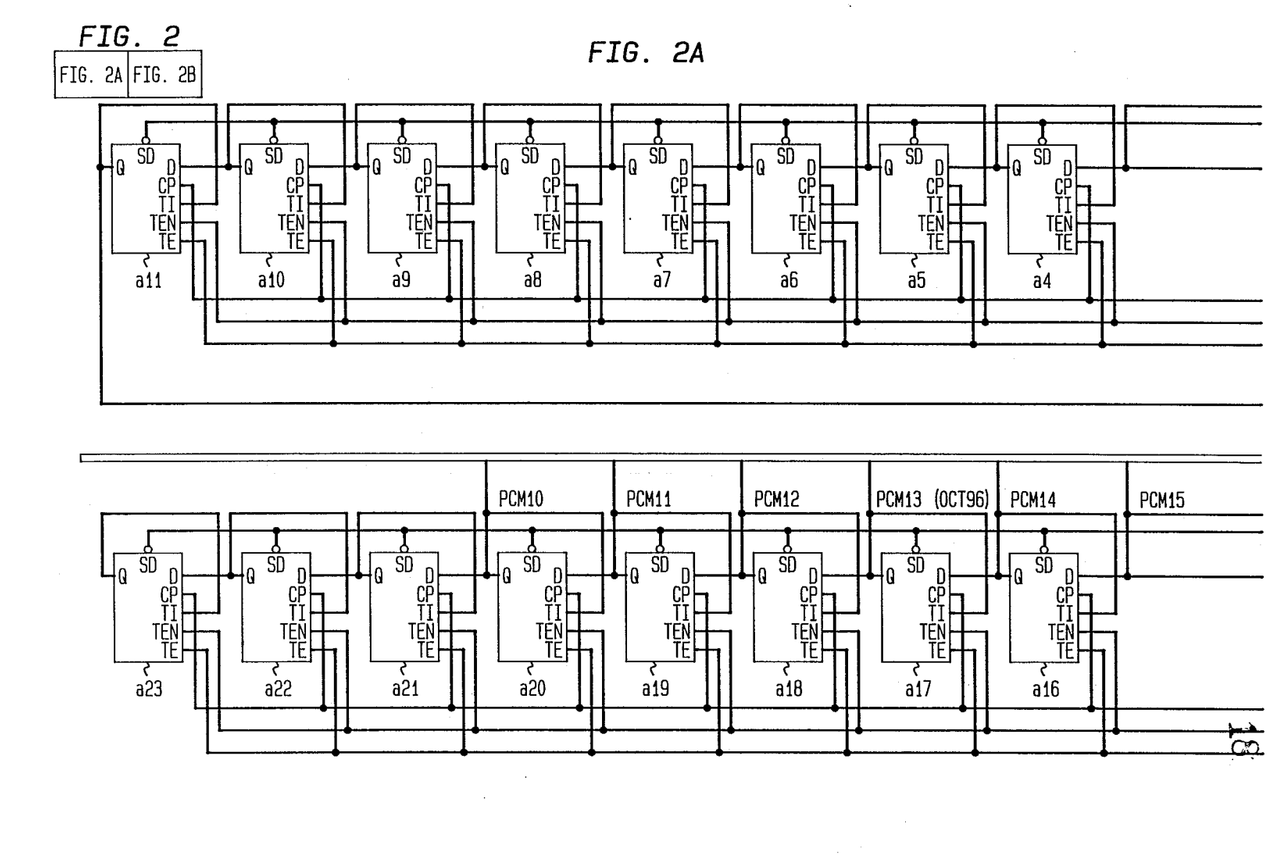
FIG. 2 is a circuit diagram of the input shift register portion of the VAZO detector of FIG. 1.
Figure 2B:
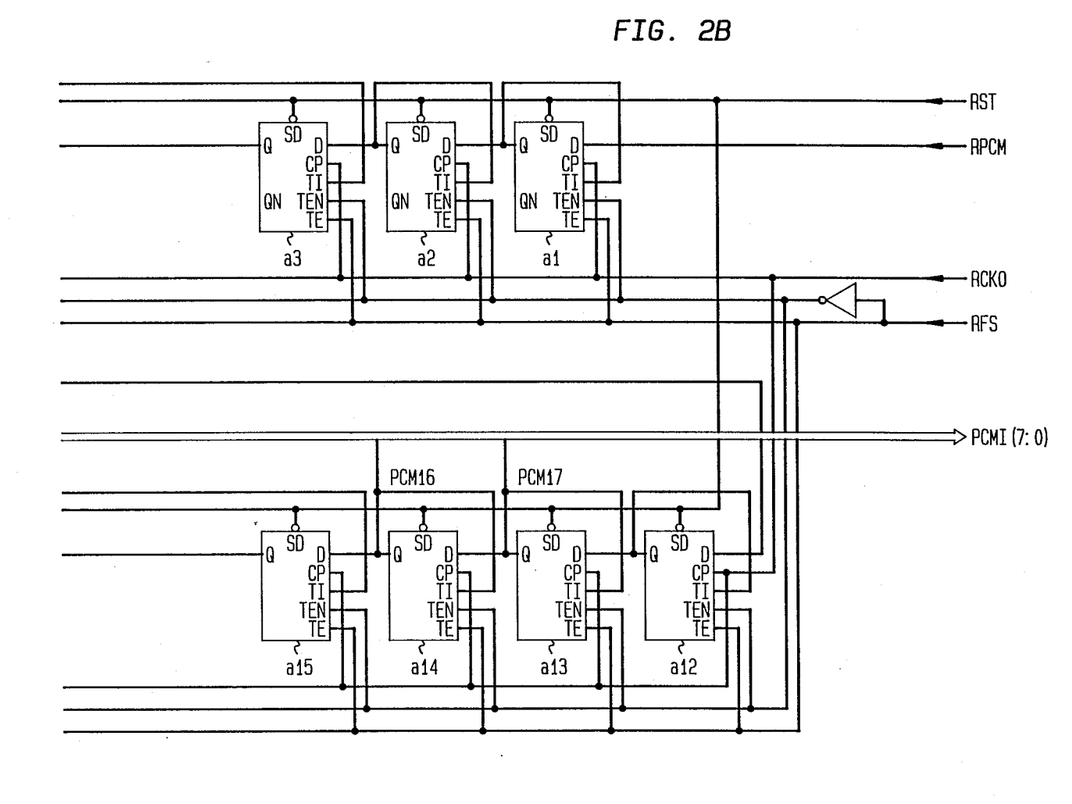

A decision as to whether the current octet is a VAZO is made when the current octet is shifted to shift register stages a9–a16, the middle 8-bits of input shift register 12. If the current octet contains all zeros, the output of NOR gate 100 in the decision logic shown by FIG. 3 becomes "high". The outputs of the stages of the shift register 12 are scanned by NOR gates 102 through 118 to determine if the adjacent octets could combine with the current octet to form a data zero string of 15 or more bits.

Figure 3A:
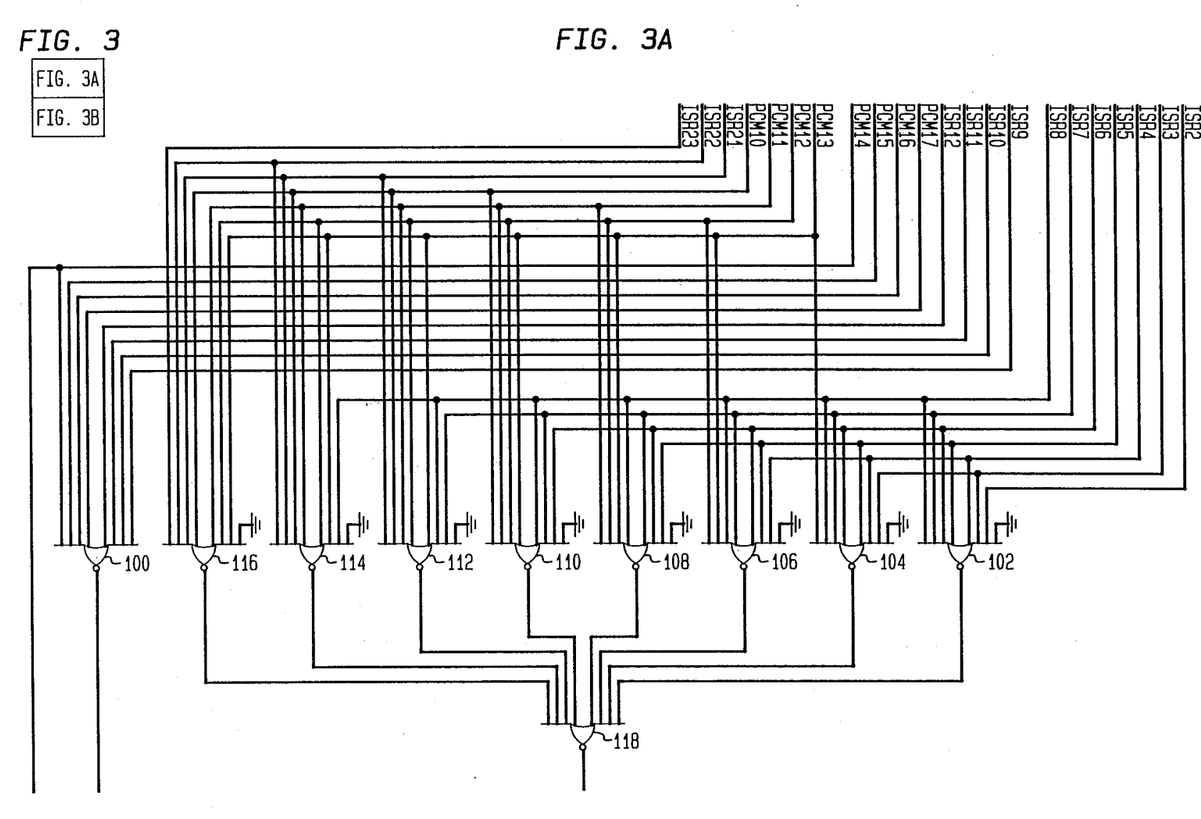
FIG. 3 is a circuit diagram of the decision logic portion of the VAZO detector of FIG. 1.
Figure 3B:
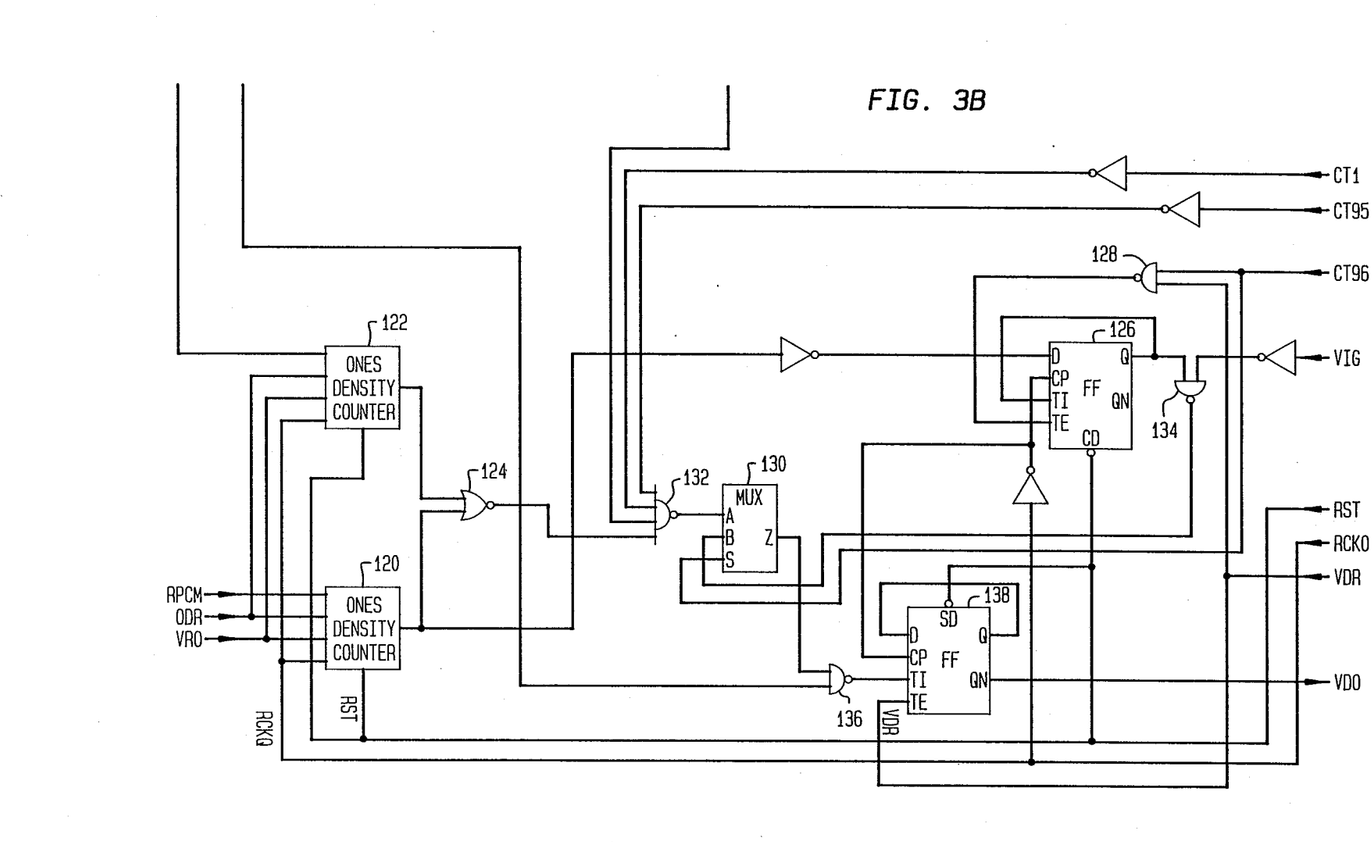

Ones density counters 120 and 122 examine the octets adjacent to the current octet to determine whether either of the adjacent octets contains less than two data "ones". Counter 120 examines the octet which follows the current octet and counter 122 examines the octet which precedes the current octet.

Figure 4:
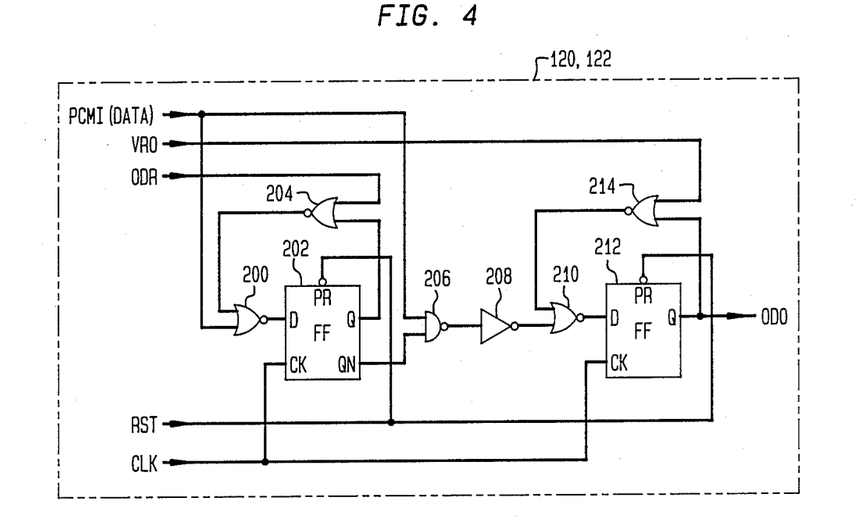
FIG. 4 is a circuit diagram of the ones density counter portion of the VAZO detector of FIG. 1.
Figure 5:
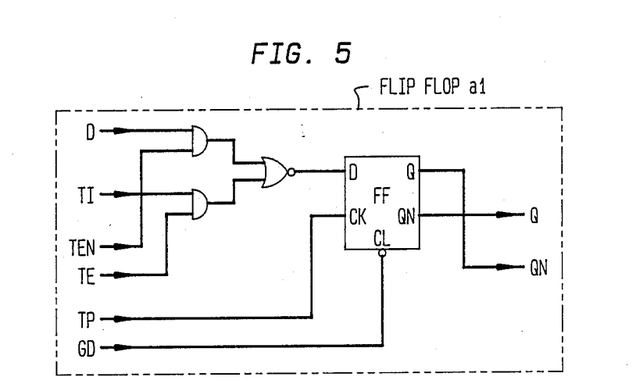
FIG. 5 is a schematic diagram of the internal circuitry of flip-flop circuits in the input shift register described in FIG. 2.
Figure 8A:
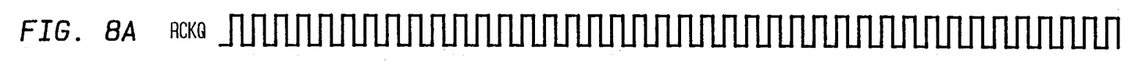
FIGS. 8(a) through 8(k) are waveform diagrams useful in explaining the operation of the circuits described with reference to FIGS. 1 through 7.
Figure 8B:
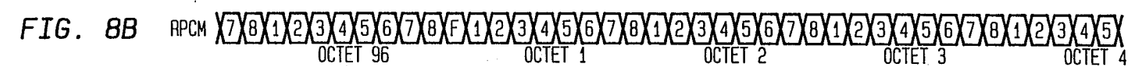
Figure 8C:
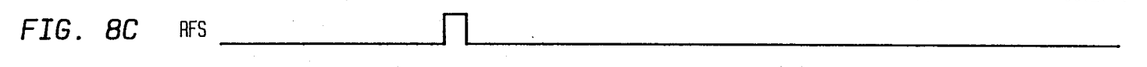
Figure 8D:
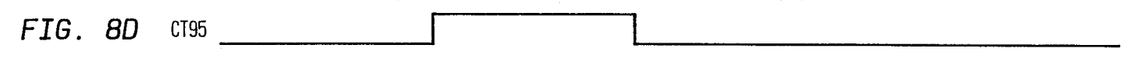
Figure 8E:
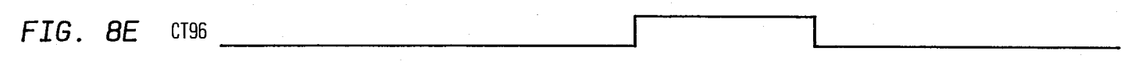
Figure 8F:
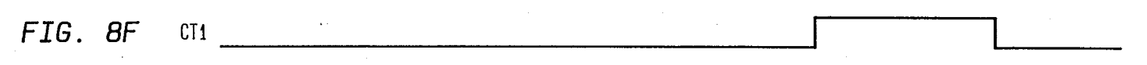
Figure 8G:
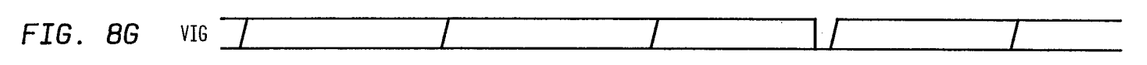
Figure 8H:
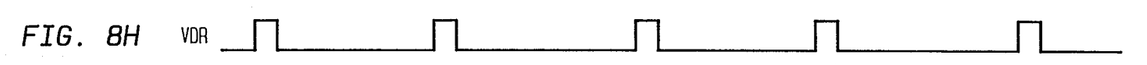
Figure 8I:
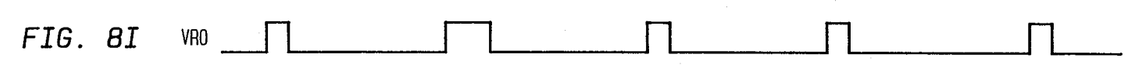
Figure 8J:
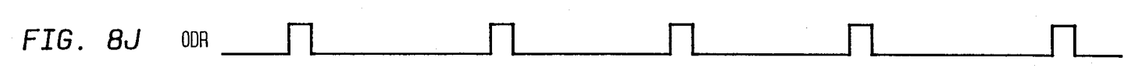
Figure 8K:
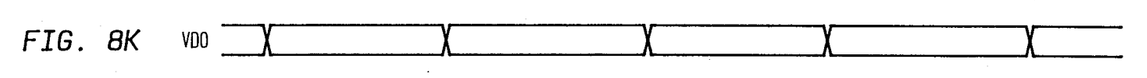

FIG. 4 illustrates the circuitry of the ones density counters 120 and 122. When the first "one" in the octet enters the ones density counter 120 or 122, the output of NOR gate 200 goes "low" and flip-flop 202 output "QN" will thus go "high" on the next clock edge. Flip-flop 202 will hold this state as long as the ODR signal (counter synchronous reset) remains "low", since the "low" state of the "Q" output of 202 and the "low" ODR signal will cause a "high" output from NOR gate 204 which in turn holds the output of NOR gate 201 "low". Once the "QN" output of flip-flop 202 is "high", the next "one" in the octet data will cause the output of NAND gate 206 to go "low". This action in turn causes the output of inverter 208 to go "high" and the output of NOR gate 210 to go "low". The next clock edge will bring a "low" state to the "Q" output of flip-flop 212, which is also the ones density counter output (ODO). As long as the synchronous reset VRO input is "low", the "low" state of ODO causes the output of NOR gate 214 to be "high" and hence the output of NOR gate 210 will remain "low" and flip-flop 212 will hold its state. At the end of the octet which is being examined for less than two data "ones", the ODR input will be set to "high" for one clock cycle to reset the flip-flop 202 such that its "QN" output is "low". The VRO input will be set to "high" during the next clock cycle to reset the flip-flop 212 such that its "Q" output (ODO) will go "high". The VAZO decision is made during the clock cycle when ODR is "high". The end result is that at the time of the VAZO decision, the output of the ones density counter, ODO, will be "low" if two or more data "ones" were found in that octet and "high" if less than two data "ones" were found. The timing relationships of the ones density counter synchronous reset ODR and VRO ones density counter secondary synchronous reset inputs are shown by waveforms 8(j) and 8(i).

The outputs of the two ones density counters 120 and 122 are coupled to NOR gate 124 of FIG. 3, which gate will go "low" if there were less than two data "ones" in either of the adjacent octets.

Figure 6:
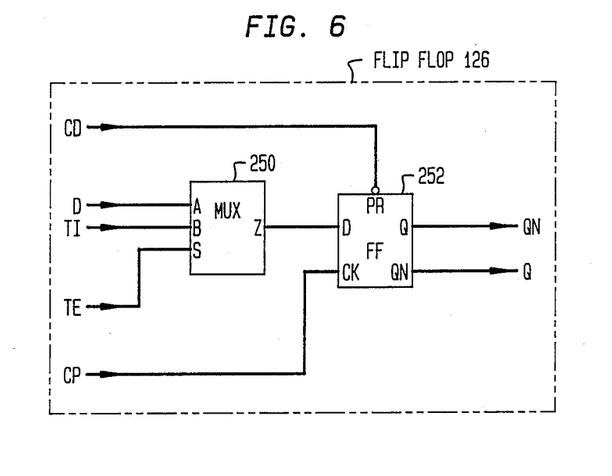
FIG. 6 is a schematic diagram of the internal circuitry of flip-flop circuits in the decision logic circuit described in FIG. 3.

Since Octet 96 is nominally moved from the end of the 96-octet group to the beginning of the group, Octet 1 will be adjacent to Octet 96. The ones density counter output for Octet 1 must therefore be held in memory until Octet 96 is reached. The memory element for this information is flip-flop 126. The internal circuits of flip-flop 126, as shown in FIG. 6, have a multiplexer 250 on the data input which allows the "TE" input to select between the "D" and "TI" inputs for the data to be latched by the D-type flip-flop 252. When the "TE" input is "high", the "TI" input is selected and when the "TE" input is "low", the "D" input is selected. In this application, "TE" is "low", selecting the ones density information from Octet 1, only when Octet 96 is the current octet (as indicated by the "octet count of 96" input CT96 being "high") and the VAZO detector synchronous reset VDR input is "high". Otherwise, flip-flop 126 holds its present state. The CT96 and VDR signals are combined in NAND gate 128.

Multiplexer 130 is used to select between the special case for Octet 96 and the normal case for the rest of the octets. For Octets 1–95, the VAZO decision information pertaining to the adjacent octets is summarized in NAND gates 132. A "high" output from NAND gate 132 indicates that if the current octet is an all-zero octet, the adjacent octets will cause it to be declared a VAZO. For Octets 2–94, the information which must be summarized is the zero string information from NOR gate 118 and the ones density information from NOR gate 124. For Octets 1 and 95, the adjacent octets are not considered. For simplicity, they are made to look the same as Octets 2–94 at the output of NAND gate 132 by using the CT1 and CT95 inputs to set the output of NAND gate 132 "high" during either Octet 1 or 95. For Octet 96, the information about the adjacent octets is summarized in NAND gate 134. This information consists of the output of flip-flop 126 and input VIG which indicates whether any other VAZOs have been found in the 96-octet group. If Octet 1 had less than two data "ones" or a previous VAZO had been found, the output of NAND gate 134 will be "high".

The adjacent octet information from multiplexer 130 is combined with the output of NOR gate 100 which is high if the current octet is an all-zero octet, in NAND gate 136. If the current octet contains all-zeros and the adjacent octets (as applicable) would combine with it to violate one or more of the above stated criteria, the output of NAND gate 136 will be "low". Otherwise, the output of NAND gate 136 will be "high".

Figure 7:
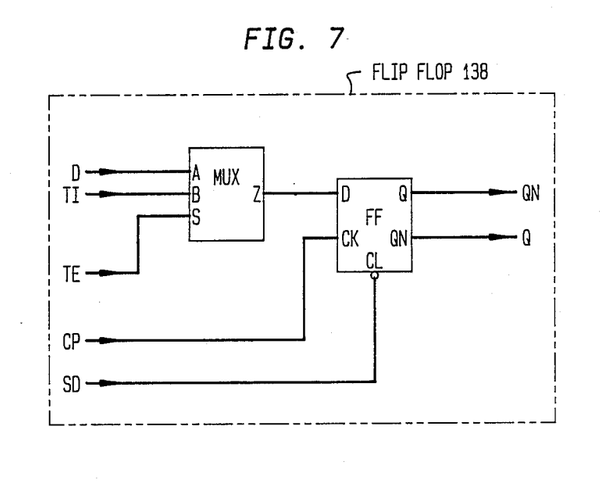
FIG. 7 is a schematic diagram of the internal circuitry of other flip-flop circuits in the decision logic circuit described in FIG. 3.

The output of the VAZO detector comes from flip-flop 138. The internal circuits of flip-flop 138, as shown in FIG. 7, are the same as those in flip-flop 126 of FIG. 6 except for the state to which the RESET input sets it. The VDR input goes "high" once per octet to allow the VAZO decision information from NAND gate 136 about the current octet to be latched into flip-flop 138. While the VDR signal is "low", flip-flop 138 holds its state.

While the present invention has been described in connection with a preferred embodiment thereof, it is to be understood that additional embodiments, modifications and applications which will become apparent to those skilled in the art are included within the spirit and scope of the claims appended hereto.

I claim:

1. A VAZO detector circuit for implementation on an integrated circuit chip for ZBTSI data transmission systems, comprising:
   input shift register means for receiving scrambled PCM data, including means for temporarily storing a current octet having an information content and two adjacent octets of said current octet in said scrambled PCM data, said adjacent octets also having an information content;
   decision logic circuit means for examining said information content of the current octet of a block of 96 8-bit channels and said two adjacent octets to determine whether their combination with said current octet is a violation of a predetermined logic criteria, said decision logic circuit including means for deriving an output signal representative of said violation of said criteria when said current octet is all-zeros and combines with said adjacent octets such that any one of the following criteria occurs;
   (a) said all-zero octet is not Octet 1, 95 or 96 and combines with said adjacent octets to form a data string of at least fifteen consecutive zeros;
   (b) said all-zero octet is not Octet 1, 95 or 96 and the data in either of said adjacent octets contains less than two logic ones;
   (c) said all-zero octet is either Octet 1 or 95;
   (d) said all-zero octet is Octet 96 and there is at least one other VAZO in the 96-octet group or the data in Octet 1 contains less than two logic ones.

2. A VAZO detector circuit in accordance with claim 1 wherein said scrambled PCM data is ZBTSI encoded.

3. A VAZO detector circuit in accordance with claim 2 wherein said ZBTSI encoded scrambled PCM data is coupled to a DS1 to telecommunication transmission line.

4. A VAZO detector circuit in accordance with claim 1 wherein the number of stages of said input shift register means is the minimum number to store said current octet plus the minimum sufficient information about said adjacent octets when a VAZO decision is made.

5. A VAZO detector circuit in accordance with claim 1 further including:
   means for providing DS1 frame synchronization pulses to said input shift register stages; and
   means for prohibiting entry of said frame synchronization pulses from the data input of said input shift register.

6. A VAZO detector circuit in accordance with the claim 1 wherein said input shift register means and said decision logic means are implemented in VLSI technology.

7. A VAZO detector circuit in accordance with claim 6 wherein said input shift register means and said decision logic means are implemented as a gate array.

8. A VAZO detector circuit in accordance with claim 6 wherein said input shift register means and said decision logic means are implemented in VLSI as a standard cell.

9. A VAZO detector circuit in accordance with claim 6 wherein said input shift register and said decision logic means are implemented in ASIC technology.

10. A VAZO detector circuit in accordance with claim 1 wherein said decision logic means includes:
    an array of NOR gates to scan said PCM data for zero strings of data that could combine with said all-zero current octet to violate said predetermined logic criteria of a string of at least fifteen consecutive zeros.

11. A VAZO detector circuit in accordance with claim 10 wherein said decision logic means includes:
    first ones density counter means for examining the adjacent octet following the current octet to determine whether said adjacent octet contains less than two logic ones; and
    second ones density counter means for examining the adjacent octet preceding the current octet to determine whether said adjacent octet contains less than two logic ones.

12. A VAZO detector circuit in accordance with claim 7, wherein said decision logic means further includes:
    latch means for storing data representative of an octet adjacent to octet 96, such that when octet 96 is processed, sufficient data is retained to enable said VAZO decision to be made.

13. A VAZO detector circuit in accordance with claim 1 wherein said input shift register means includes:
    means for buffering said PCM data; and
    means for coupling said buffered PCM data from said detector to minimize the number of gates in a VLSI implementation.

* * * * *